(12) United States Patent
Hönigschmid

(10) Patent No.: US 6,292,386 B1
(45) Date of Patent: Sep. 18, 2001

(54) INTEGRATED MEMORY HAVING CELLS OF THE TWO-TRANSISTOR/TWO-CAPACITOR TYPE

(75) Inventor: Heinz Hönigschmid, Starnberg (DE)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 09/699,983

(22) Filed: Oct. 30, 2000

(30) Foreign Application Priority Data

Oct. 29, 1999 (DE) .................................. 199 52 311

(51) Int. Cl.<sup>7</sup> .................................................. G11C 11/22
(52) U.S. Cl. .......................... 365/145; 365/222; 365/190
(58) Field of Search .................................. 365/145, 222, 365/149, 150, 190

(56) References Cited

U.S. PATENT DOCUMENTS 5,381,364 * 1/1995 Chern et al. .......................... 365/145
5,675,530   10/1997 Hirano et al. ......................... 365/145

FOREIGN PATENT DOCUMENTS 41 10 407 A1   10/1991 (DE) ............................... G11C/11/22

* cited by examiner

Primary Examiner—Andrew Q. Tran
(74) Attorney, Agent, or Firm—Herbert L. Lerner; Laurence A. Greenberg; Werner H. Stemer

(57) ABSTRACT

The integrated memory has memory cells each with two transistors and two capacitors. Unlike conventional 2-transistor/2-capacitor memory cells, the plate electrodes of the capacitors are connected to different plate potentials.

5 Claims, 4 Drawing Sheets

INTEGRATED MEMORY HAVING CELLS OF THE TWO-TRANSISTOR/TWO-CAPACITOR TYPE

BACKGROUND OF THE INVENTION

FIELD OF THE INVENTION

The invention lies in the integrated technology field. More specifically, the invention relates to an integrated memory having cells of the 2-transistor/2-capacitor type.

U.S. Pat. No. 5,381,364 discloses an FRAM, i.e. FeRAM, type memory (ferroelectric random access memory) with cells of that type. In FRAMs, the memory capacitors comprise a ferro-electrical dielectric. An electrode of the two memory capacitors of each memory cell is connected to a respective bit line of a bit line pair via the controllable system of the appertaining selecting transistor. Control terminals of the two selecting transistors are connected to a common word line. The second electrodes of the two memory capacitors of each memory cell are connected to a common plate line. As a result, the potential at these electrodes of the memory capacitors is always the same during the operation of the memory.

SUMMARY OF THE INVENTION

In view of the forgoing it is an object of the invention to provide an integrated memory having cells of the 2-transistor/2-capacitor type which overcomes the above-noted deficiencies and disadvantages of the prior art devices and methods of this kind, and wherein the memory cells have a different structure from the prior art memory cells.

With the above and other objects in view there is provided, in accordance with the invention, an integrated memory, comprising:

bit lines and word lines disposed to form points of intersection;

memory cells arranged at the points of intersection and each including a first transistor, a second transistor, a first capacitor, and a second capacitor;

the first transistor having a controlled path and the first capacitor having a first electrode connected to one of the bit lines via the controlled path of the first transistor;

the first capacitor having a second electrode connected to a first plate potential, wherein the first plate potential remains constant during an access of the memory cell;

the second transistor having a controlled path and the second capacitor having a first electrode connected to another of the bit lines via the controlled path of the second transistor;

the second capacitor having a second electrode connected to a second plate potential different from the first plate potential, wherein the second plate potential remains constant during an access of the memory cell;

the first and second transistors having control terminals connected to at least one of the word lines, whereby the first and second transistors are simultaneously switched to conduct upon an access to the memory cell; and wherein a potential of the bit lines prior to the first and second transistors being switched to conduct is a bias potential between the first and second plate potentials and substantially at a mean value of the first and second plate potentials.

In other words, the electrodes of the novel memory cells which are averted from the transistors, of the two capacitors of each memory cell are connected to plate potentials that are different from one another during an accessing of the memory cell. These are a first plate potential and a second plate potential.

It is thus possible that a bias potential for the two bit lines that are connected to the memory cell can be selected between the first and the second potentials. In contrast, in conventional FRAMs, particularly those which function according to what is known as the VDD/2 concept, the selection of the bias potential of the bit lines is very limited. In those types of memories, the electrodes of the memory capacitors that are averted from the selecting transistors are permanently situated at half the value of the supply potential VPD. In order to obtain an meaningful evaluation of a difference signal that arises on the bit line pair in the read process, it is necessary to "precharge" both bit lines to ground prior to the read operation—that is to say, to discharge them. Therefore, in these conventional memories, the bias potential cannot be freely selected within a larger range of values. By contrast, in the invention the bias potential can be selected from a larger range; it need only be between the first and second plate potentials.

In the invention, the best results can be achieved for FRAMs that function according to the VDD/2 principle when the bias potential of the bit lines prior to a switching of the transistors of the memory cell to conduct corresponds to a mean value of the first and second plate potentials. A maximal difference signal then arises on the bit line pair during the read process.

In accordance with an added feature of the invention, in order to prevent data loss of the memory cells, a refresh mode of the memory is expediently provided, in which a reading and rewriting of the information that is stored in the memory cells occur.

In accordance with an additional feature of the invention, each memory cell comprises two shorting elements connected to short one of the capacitors while the first and second transistors of the respective memory cell are non-conductive.

This is an alternative to the refresh mode. Here, the memory cells each have two shorting elements, each of which serves to short one of the capacitors as long as the two transistors of the memory cell are not conductive. In ferroelectric memory capacitors, data loss is prevented as long as the potential at the two electrodes of the capacitors is the same; that is, as long as no voltage drops across the capacitor.

The control terminals of the two transistors of each memory cell can be connected either to a common word line or to different word lines that switch the transistors into conduct and block them simultaneously when the memory cell is accessed in that they are activated and deactivated at the same time, respectively.

In accordance with a concomitant feature of the invention, the memory is a ferroelectric memory, and the capacitors comprise a ferroelectric dielectric. In other words, the invention is suitable for ferroelectrical memories of the FRAM type, in particular those which function according to the VDD/2 principle. But it can also be applied to other memories, such as FRAMs that function according to what is known as the pulsed plate principle, in which the potential of the electrode of the memory capacitors that is averted from the selecting transistor is pulsed during a memory access; or to any other memories with memory cells of the 2-transistor/2-capacitor type.

Other features which are considered as characteristic for the invention are set forth in the appended claims.

Although the invention is illustrated and described herein as embodied in an integrated memory having cells of the 2-transistor/2-capacitor type, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
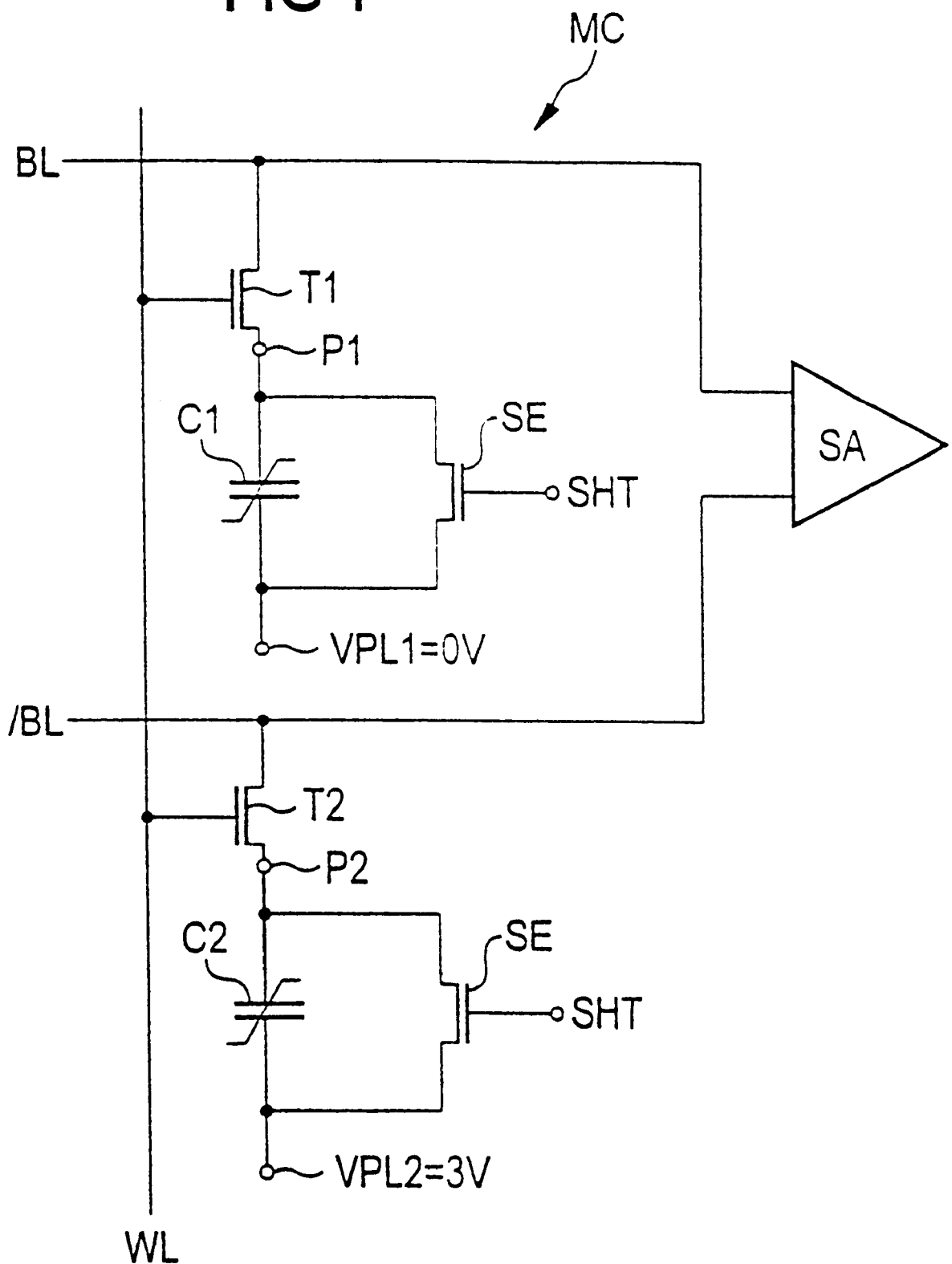
FIG. 1 is a schematic diagram of a 2-transistor/2-capacitor memory cell of the memory according to the invention.

Referring now to the figures of the drawing in detail and first, particularly, to FIG. 1 thereof, there is seen a structure of a 2-transistor/2-capacitor memory cell of an inventive memory of the FRAM type. Each memory cell MC of them memory comprises two selecting transistors T1, T2 and two memory capacitors C1, C2. The capacitors C1, C2 are formed with a ferroelectric dielectric. The one electrode of each capacitor C1, C2 is connected to a respective bit line BL, /BL of a bit line pair via the controllable system of the respective transistor T1, T2. The two bit lines are connected to a read amplifier SA, which serves to amplify a difference signal that arises on the bit line pair when the memory cell MC is read-accessed.

Control terminals of the two transistors T1, T2 are connected to a word line WL. Via the word line WL and the bit line pair BL, /BL, the selection of a specific cell MC of the memory is accomplished. The electrodes of the capacitors C1, C2 that are averted from the transistors T1, T2 are connected to two different constant plate potentials VPL1= 0V and VPL2=3V. The memory cell MC represented in FIG. 1 further comprises two shorting elements SE in the form of n-channel transistors, whose controllable systems each connect the two electrodes of one of the two capacitors C1, C2 to each other. Control terminals of the shorting elements SE are connected to a shorting signal SHT. The shorting elements SE serve to bring the two electrodes of the respective capacitor C1, C2 to the same potential while the respective transistors T1, T2 are blocked. There is then no voltage at the capacitors C1, C2, and so the information stored thereby remains permanently stored.

In other exemplary embodiments of the memory cell MC, the shorting elements SE can be omitted. In order to still prevent data loss of the capacitors C1, C2, it may be necessary in this case to provide a refresh mode in which the contents of each memory cell MC are read out and then written back into the memory cell from time to time.

Figure 2:
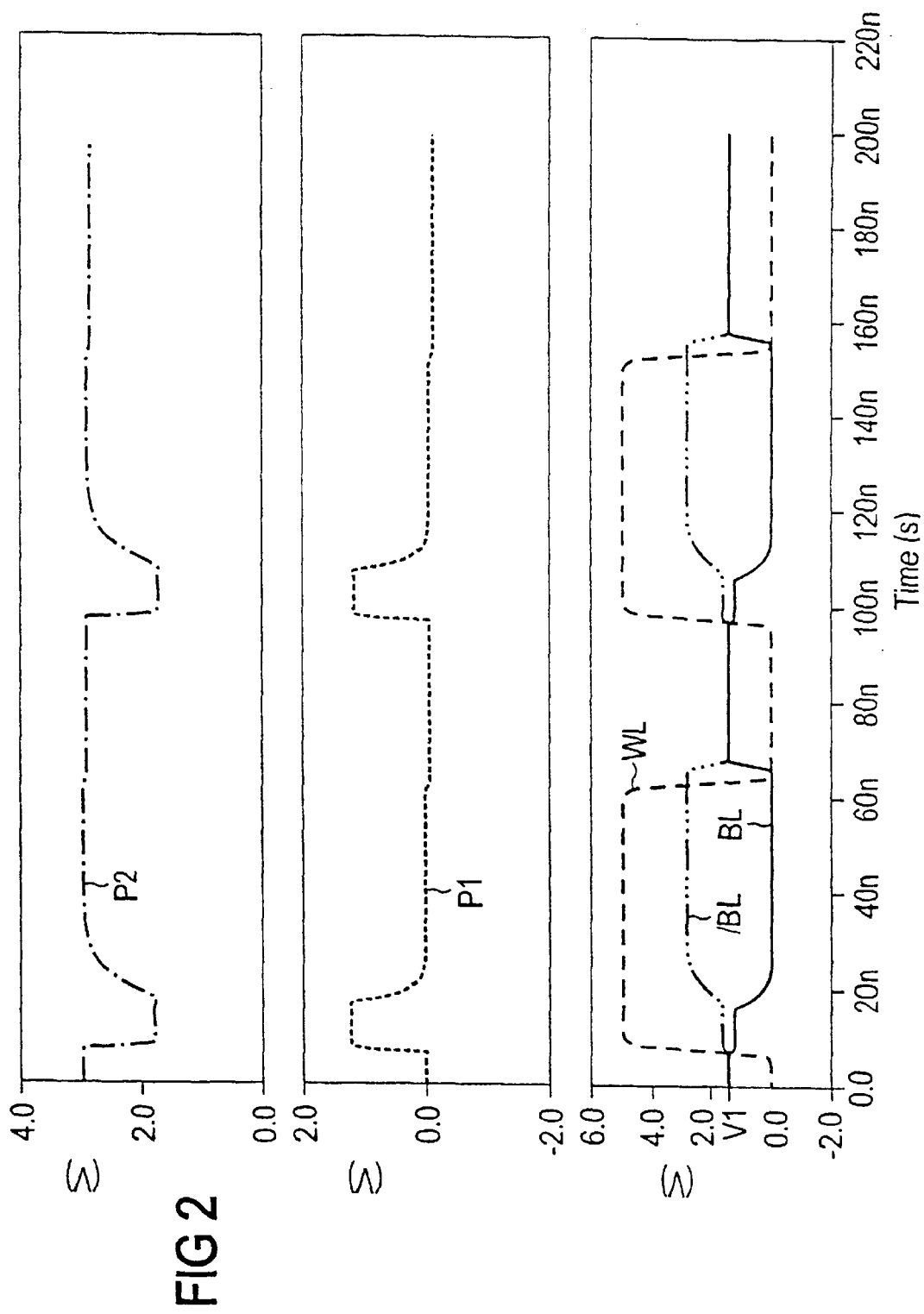
FIG. 2 is a time graph showing the signal characteristics of the memory cell of FIG. 1.

Referring now to FIG. 2, there are shown signal characteristics that arise in a read access operation of the memory cell MC represented in FIG. 1. The top diagram of FIG. 2 represents the potential curve of the electrode of the second capacitor C2 which is connected to the transistor T2. The middle diagram in FIG. 2 represents the potential curve of the electrode of the first capacitor C1 which is connected to the first transistor Ti. The bottom diagram represents the potential curve of the word line WL and of the two bit lines BL, /BL. The potential curve during two successive read accesses is shown, whereby a logical "0" is stored in the memory cell MC.

Before the memory cell MC is read accessed, the two bit lines BL, /BL are precharged to a common bias potential V1=1.5V. This corresponds to the average value of the two plate potentials VPL1=0V and VPL2=3V. The word line WL then becomes active with a positive edge. The transistors T1, T2 are thereby switched to conduct, so that a charge equalization occurs between the bit lines BL, /BL and the capacitors C1, C2. In the present case of a stored logical "0", the potential of the first bit line BL is slightly reduced, and the potential of the second bit line /BL is slightly increased. Next, the read amplifier SA is activated, whereby the difference signal on the bit line pair BL, /BL is amplified. The read access ends with a negative edge of the potential on the word line WL.

Figure 3:
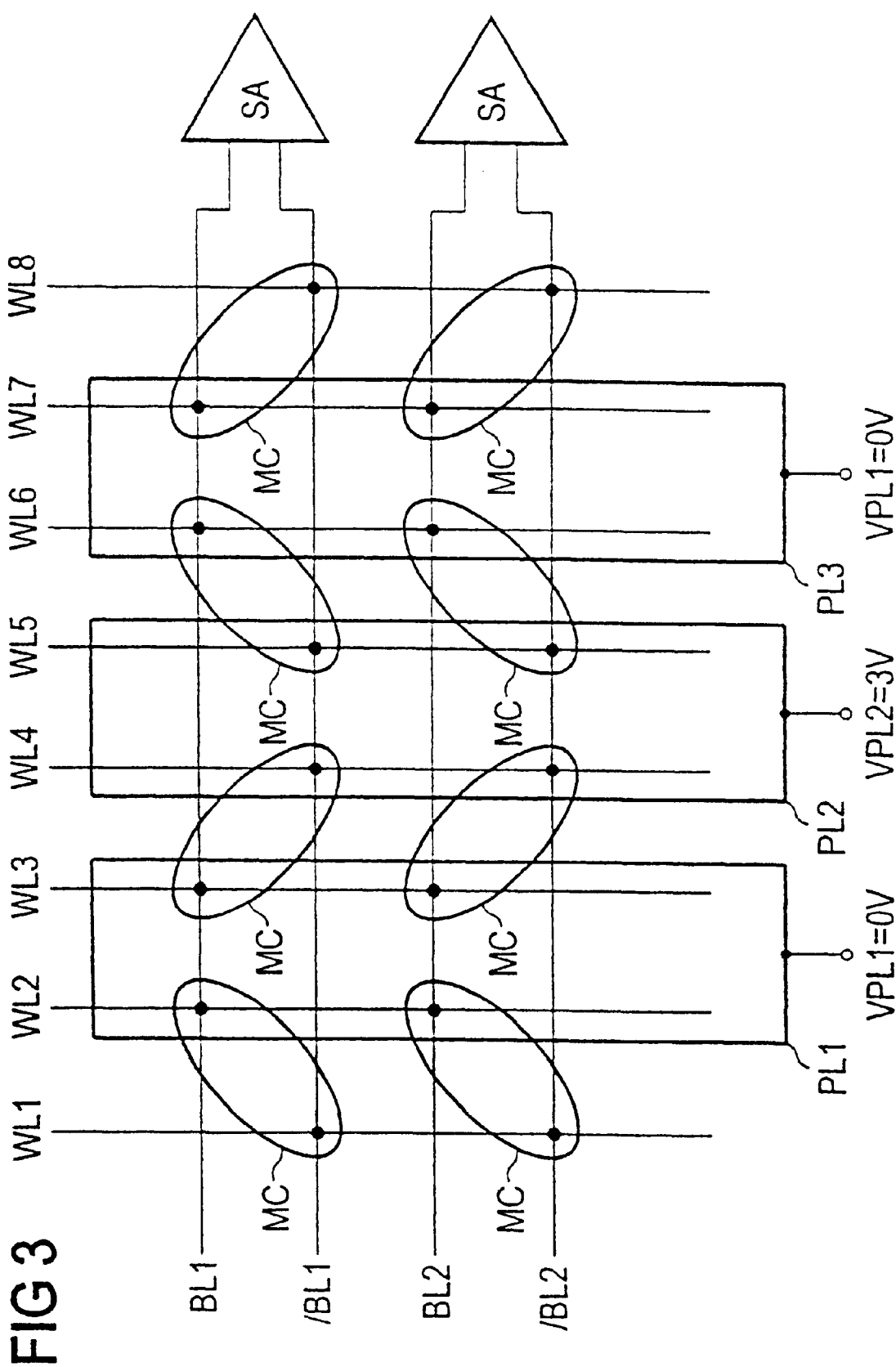
FIG. 3 is a layout diagram of a section of the integrated memory in which plate lines run parallel to the word lines.
Figure 4:
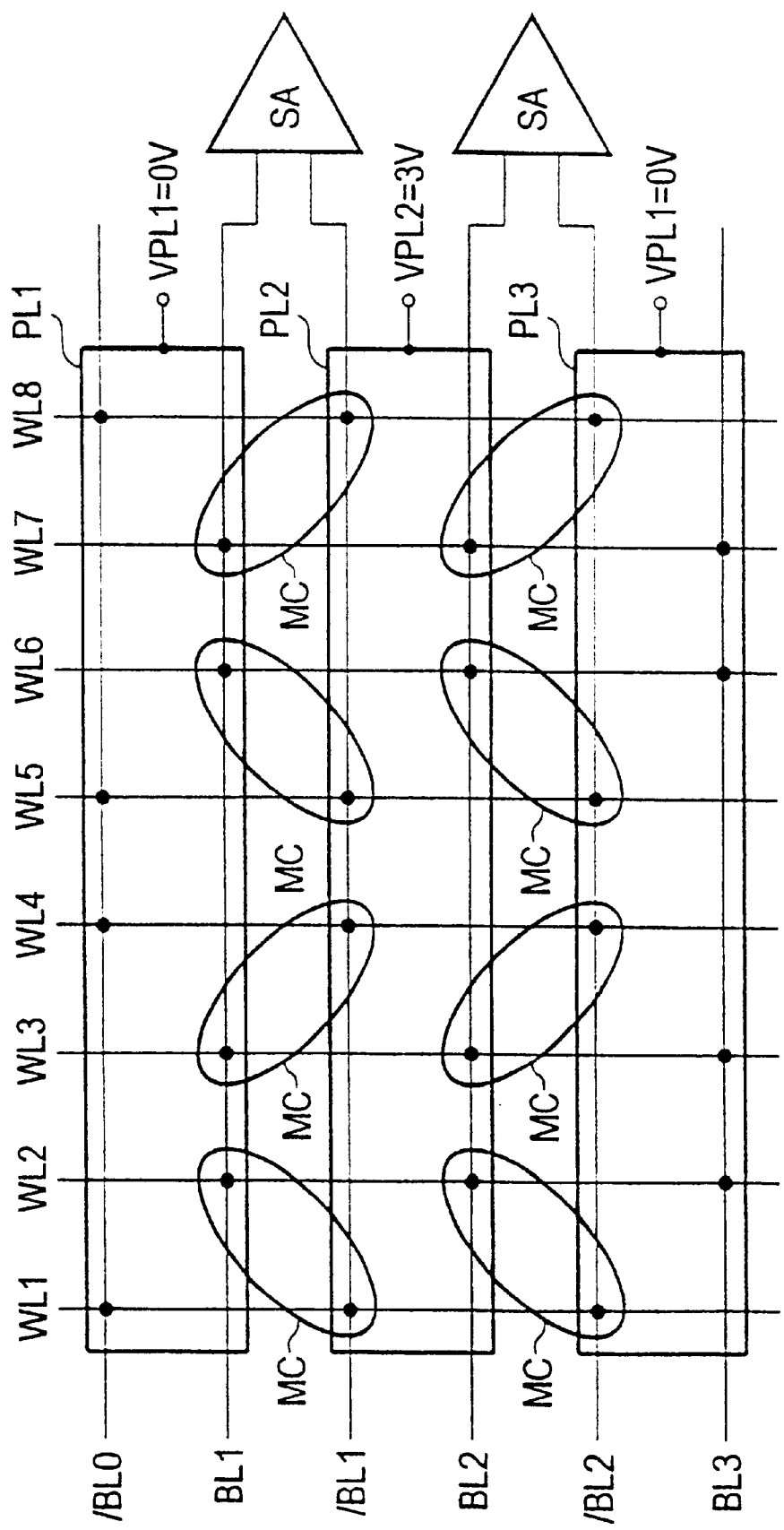
FIG. 4 is a layout diagram of a section of a novel memory in which the plate lines run parallel to the bit lines.

FIGS. 3 and 4 show larger sections of various exemplary embodiments of the memory according to the invention, which respectively comprise memory cells MC of the type represented in FIG. 1. Here, the first plate potential VPL1 and the second plate potential VPL2 are fed with the aid of plate lines PL1.

In the memory represented in FIG. 3, the plate lines PLi run parallel to the word lines WLm. The memory cells MC are respectively indicated by two points and an oval. The points are located in the intersections of the bit lines BLn, /BLn and the word lines WLm which are allocated to the respective memory cell. Unlike the memory cell MC in FIG. 1, the control terminals of the transistors T1, T2 in the memory cells MC in FIG. 3 are not connected to a respective common word line WL, but rather to two adjacent word lines WL1, WL2; WL3, WL4, and so on, respectively.

The plate lines PLi in FIG. 3 are constructed such that they extend over two respective polysilicon word lines WL2, WL3; WL4, WL5, etc., which are respectively allocated to different memory cells MC. The plate lines PLi are connected either to the first plate potential VPL1 or to the second plate potential VPL2. The two plate potentials VPL1, VPL2 thus always arise in adjacent plate lines PLi in alternation. What this accomplishes is that the electrodes, which are averted from the transistors T1, T2, of the capacitors C1, C2 of each memory cell MC are each connected to different plate potentials VPL1, VPL2.

FIG. 4 shows a variant of the memory represented in FIG. 3, in which the plate lines PLi are not arranged parallel to the word lines WLm, but rather parallel to the bit lines BLn and /BLn. Whereas FIG. 3 only shows two of the bit line pairs of the integrated memory, FIG. 4 shows two bit line pairs in their entirety and one of the bit lines of each of two additional bit line pairs, namely /BL0 and BL3. In the exemplifying embodiment according to FIG. 4, as well, it guaranteed that the electrodes of the capacitors C1, C2 of each memory cell MC which are averted from the appertaining transistor T1, T2 are connected to different plate potentials VPL1, VPL2. And, according to FIG. 4 adjoining plate lines PLi are also connected to different plate potentials VPL1, VPL2, respectively.

I claim:

1. An integrated memory, comprising:

bit lines and word lines disposed to form points of intersection;

memory cells arranged at said points of intersection and each including a first transistor, a second transistor, a first capacitor, and a second capacitor;

said first transistor having a controlled path and said first capacitor having a first electrode connected to one of said bit lines via said controlled path of said first transistor;

said first capacitor having a second electrode connected to a first plate potential, wherein the first plate potential remains constant during an access of said memory cell;

said second transistor having a controlled path and said second capacitor having a first electrode connected to another of said bit lines via said controlled path of said second transistor;

said second capacitor having a second electrode connected to a second plate potential different from the first plate potential, wherein the second plate potential remains constant during an access of said memory cell;

said first and second transistors having control terminals connected to at least one of said word lines, whereby said first and second transistors are simultaneously switched to conduct upon an access to said memory cell; and wherein a potential of said bit lines prior to said first and second transistors being switched to conduct is a bias potential between the first and second plate potentials and substantially at a mean value of the first and second plate potentials.

2. The integrated memory according to claim 1, wherein said memory cells are configured to be operated in a refresh mode wherein an information content stored in said memory cells is read and rewritten.

3. The integrated memory according to claim 1, wherein each said memory cell comprises two shorting elements connected to short one of said capacitors while said first and second transistors of said respective memory cell are non-conductive.

4. The integrated memory according to claim 1, wherein said word lines connected to said control terminals of said first and second two transistors of each memory cell are formed by a respective common word line.

5. The integrated memory according to claim 1, wherein the memory is a ferroelectric memory, and said capacitors comprise a ferroelectric dielectric.

* * * * *